United States Patent [19]

Sato

[11] Patent Number: 5,325,333

[45] Date of Patent: Jun. 28, 1994

[54] SEMICONDUCTOR MEMORY DEVICE

[75] Inventor: Toshiya Sato, Tokyo, Japan

[73] Assignee: NEC Corporation, Tokyo, Japan

[21] Appl. No.: 996,628

[22] Filed: Dec. 24, 1992

[30] Foreign Application Priority Data

Dec. 27, 1991 [JP] Japan ................................ 359819

[51] Int. Cl.$^5$ ............................................. G11C 7/00
[52] U.S. Cl. ............................... 365/200; 365/230.03; 371/10.1
[58] Field of Search ............. 365/200, 230.03, 230.08, 365/225.7; 371/10.1, 10.2, 10.3

[56] References Cited

U.S. PATENT DOCUMENTS

| | | | |
|---|---|---|---|
| 4,947,378 | 8/1990 | Jinbo et al. | 365/200 |
| 5,018,104 | 5/1991 | Urai | 365/200 |
| 5,233,566 | 8/1993 | Imamiya et al. | 365/200 |

Primary Examiner—Eugene R. LaRoche
Assistant Examiner—Vu Le
Attorney, Agent, or Firm—Mason, Fenwick & Lawrence

[57] ABSTRACT

A semiconductor memory device uses a memory cell array having of a plurality of cell array blocks, a redundancy cell array as a replacement for a cell array block containing a faulty memory cell, a replacement-information memory circuit for holding faulty-cell detection information and discrimination information of a cell array block containing a faulty cell in a plurality of memory transistors each, in normal mode, with source and control gate electrodes kept at ground potential and a drain electrode kept at a specified voltage of lower potential than the supply voltage. Each is forced into depletion or enhancement mode depending on the accumulated charge on the floating gate. The memory also includes a redundancy selector for outputting the redundancy signal which goes to active level by the decision based on an information held in this replacement-information memory circuit that a cell array block containing a faulty cell has been selected.

11 Claims, 6 Drawing Sheets

SEMICONDUCTOR MEMORY DEVICE

BACKGROUND OF THE INVENTION

1. Field of the Invention

This invention relates to a semiconductor memory device, and more particularly to the same with an electrically erasable and programmable read-only memory (EEPROM) element for keeping store information for instructing the replacement with a redundancy cell array.

2. Description of the Prior Art

Regarding a large capacity semiconductor memory device, faulty memory cell is found at a high incidence in the memory cell array. For overcoming this and increasing the yield redundancy technique of providing redundant elements replacing faulty elements is generally used.

Redundancy technique is various, for example, replacement for a memory cell array arranged in row and column directions in row or column unit by a certain number of redundancy cell rows or columns provided, or replacement for a specified storage capacity memory cell array consisting of blocks each including a specified number of memory cells arranged in block unit by a redundancy cell array having the same memory capacity as has one block.

In a semiconductor memory device of block-unit redundancy design by which replacement of a block containing a faulty memory cell by a redundant cell array is accomplished, after selecting a block of a memory cell array by a first address signal and then selecting a memory cell from the block by a second address signal, the write or readout of data into or from the memory is carried out. When the selected block contains a faulty memory cell, the write or readout of data can be carried out using the redundancy cell array.

Switch to the redundancy cell array is accomplished by a replacement-information memory circuit for holding replacement-request information indicating whether the memory cell array contains a faulty cell or not and discrimination-information indicating a block containing a faulty cell; and a redundancy selector which judges on the basis of these information whether a block selected by a first address signal contains a faulty cell or not.

The replacement-information memory circuit comprises a plurality of field effect transistors as electrically programmable read-only memory elements (Each transistor is referred to as memory transistor hereinafter).

In this memory transistor, in the state of the floating gate with no injected electrons on it, application of a specified voltage (usually supply voltage) to the control gate electrode results in forming a channel between the source and drain electrodes, through which electric current flows. In the state of the floating gate with injected electrons on it, if a specified voltage is impressed to the control gate electrode, the accumulated electrons on the floating gate inhibits formation of channel between the source and drain electrodes , hence no current flowing between them. By utilization of this characteristic of the memory transistor described above, the replacement-information memory circuit can hold replacement-request information and discrimination information as described above.

Injection of electrons into the floating gate region of the memory transistor is performed as follows:

Using the source electrode as a reference potential, high voltage is applied to the drain electrode and the control gate electrode to attract hot electrons generated between the source and drain electrodes. Consequently the thus-injected electrons are trapped at the floating gate located on the way of the attraction path.

Similarly, application of a high voltage to the control gate electrode using the source and drain electrodes as reference potential induces source electrode and drain electrode, in combination with a large electric field applied between the source/drain electrodes and control gate electrode, induces a Fowler-Nordheim tunneling current, and thus electrons are injected into the region of the floating gate located between these electrodes.

In the above-mentioned way of the injection of electrons into the floating gate region, the above-mentioned replacement-request information and discrimination information are written and stored in the specified memory transistors of the replacement-information memory circuit. The writing is carried out at the stage of products inspection. Thereafter the control gate electrodes of all memory transistors of the replacement-information memory circuit about every product are fixedly connected to the supply voltage terminal to be always allowed to read the stored information out of them.

Storage of a binary 1 or 0 in the above-mentioned memory transistors of the replacement-information memory circuit is carried out by injection of electrons to the floating gate region. Because of this, very thin insulating films between the floating gate and the source/drain electrodes and between the floating gate and control gate electrode are formed. Once the semiconductor memory device comprising the replacement-information memory circuit is connected to a supply source, the supply voltage is always applied to the control gate electrode of the memory transistor, and the resulting large electric field is applied to the accumulated electrons on the floating gate, which leaks out little by little because of very small flaws inevitable in the fabrication process in the insulating film and the occurrence of Fowler-Nordheim tunneling current. Thus there is danger associated with a long-term use them that the memory information of the replacement-information memory circuit fades away.

BRIEF SUMMARY OF THE INVENTION

Object of the Invention

It therefore is an object of the present invention to provide a semiconductor memory device permitting to prevent the memory information of a replacement-information memory circuit from fading away and thus being possible to endure a long-term use.

Summary of the Invention

A semiconductor memory device according to the present invention comprises a memory cell array including a plurality of cell array blocks, each consisting of a number of memory cells, data being written into or read from a memory cell selected by a address signal; a redundancy cell array for working as a replacement for a cell array block containing a faulty cell if the cell array block is selected by the address signal; a replacement-information memory circuit including a plurality of memory transistors, in normal mode, each being capable of switching to depletion or enhancement mode depending on the accumulated charge on the floating gate, with the source and control gate electrodes kept at a reference potential and the drain electrode kept at a potential adequately lower than supply voltage so that replacement information consisting of replacement-request information for indicating whether replacement with the redundancy cell array is needed or not and discrimination information for discriminating the cell array block containing the faulty memory cell are stored on each memory transistor; and a redundancy selector for switching to the redundancy cell array in response to information outputted from the replacement-information memory circuit, which indicates whether a cell array block containing a faulty memory cell has been selected or not.

With regard to this semiconductor memory device, as described above, in normal mode, the source and control gate electrodes and the drain electrode of the memory transistor are kept at a reference potential and kept adequately lower than supply voltage, with the results that the difference in potential between the source and control gate electrodes is zero and that between the drain and control gate electrodes is adequately lower than supply voltage. This results in a reduced electric field applied to the accumulated charge on the floating gate located between the control gate electrode and the source/drain electrodes, and contributes to prevent the replacement information from fading away.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE PREFERRED EMBODIMENTS

Figure 1:
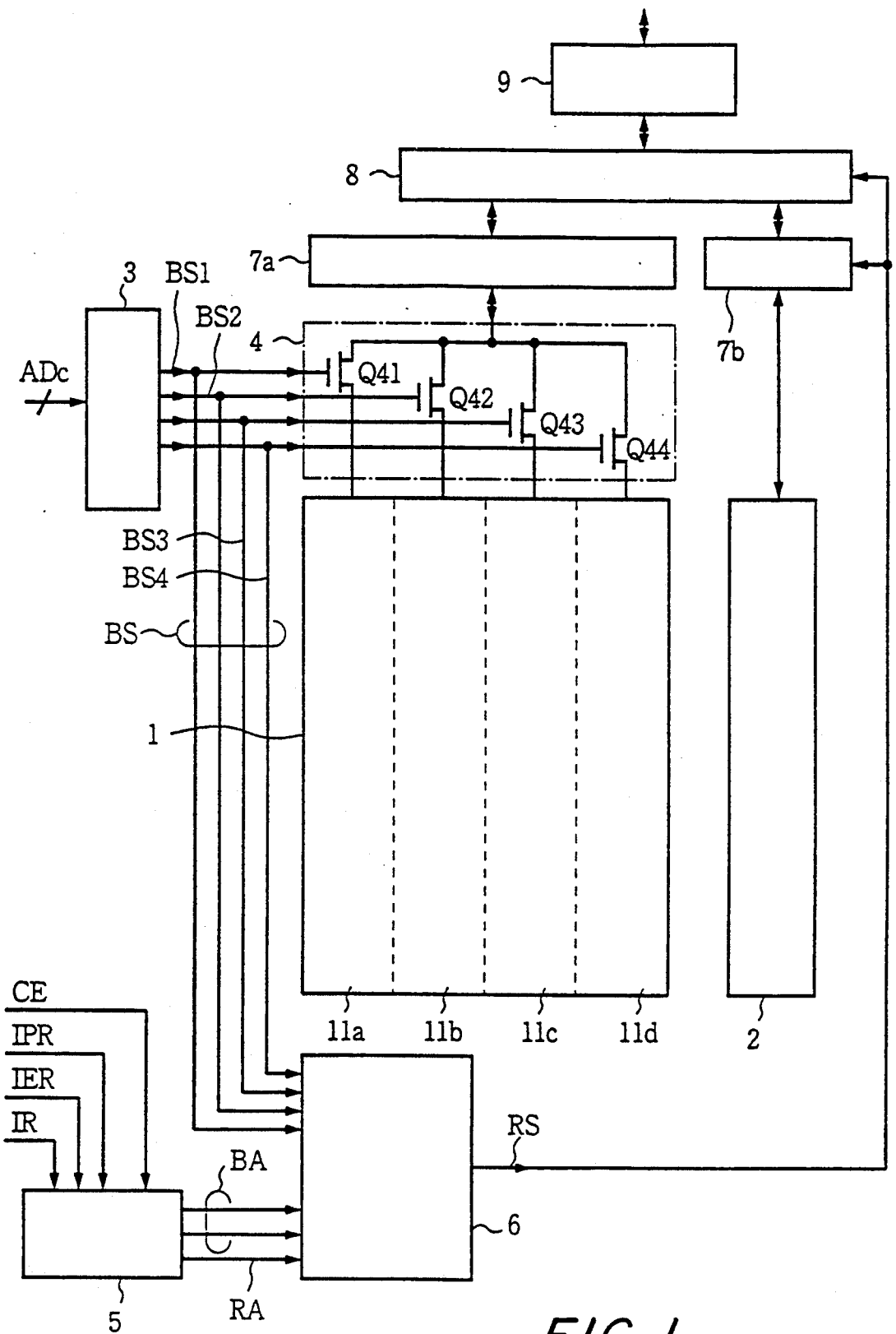
FIG. 1 is a block circuit diagram of the first embodiment of the present invention.

Referring to FIG. 1, the first embodiment of the present invention will be described below, which is a semiconductor memory device, of which circuit configuration is diagrammed in FIG. 1. It comprises components (A) to (J): (A) A memory cell array 1 consisting of a plurality of cell array blocks 11a to 11d each containing a number of memory cells (not shown). A suitable memory cell into and from which data is to be written and read is selected by a first address signal (not shown in FIG. 1); (B) a redundancy cell array 2 responds an active-level redundancy signal RS by performing write/readout of data as the replacement for a cell array block if it contains a faulty memory cell; (C) a decoder 3 for decoding a second address signal ADc and outputting a block signal BS1, BS2, BS3 or BS4 by which the corresponding cell array block 11a, 11b, 11c or 11d is selected; (D) a block selector 4 includes transistors Q 41 to Q44 , each, once receiving a block signal BS1, BS2, BS3 or BS4 at the gate electroder is turned ON to allow data to transfer from or to a write/sense amplifier 7 a to or from the selected cell array block; (E) a replacement-information memory circuit 5 includes a plurality of memory transistors (not shown) each, in normal mode except write mode, with the source and control electrodes kept at ground potential and the drain electrode kept at a potential a predetermined voltage lower than the supply voltage, changing into either depletion or enhancement mode depending on how the floating gate is charged. Memory circuit 5, in write mode, holding replacement information RA consisting of a replacement-request information RA to control how the floating gate is charged to decide whether switch to redundancy cell array 2 is to be made or not, and a block address BA for discriminating the faulty cell-containing cell array block; (F) a redundancy selector 6 receiving the replacement information RA, BA and block signals BS1 to BS4, and outputting a redundancy signal RS which, once a faulty cell-containing cell array block has been selected by a second address signal ADc, goes to an active level; (G) a write/sense amplifier 7a allowing write-data to transfer from switching circuit 8 to block selector 4, and amplifying readout-data from block selector 4 and transferring them to switching circuit 8; (H) a redundancy write/sense amplifier 7b which is activated in response to an active-level redundancy signal RS to allow write-data to transfer from switching circuit 8 to redundancy cell array 2, and amplifying readout-data from redundancy cell array 2 and transferring them to switching circuit 8; (I) a switch circuit 8 responding to a redundancy signal RS by switching between write/sense amplifiers 7a, 7b; and (J) an input-/output buffer circuit 9 for controlling the transfer of write and readout data between switching circuit 8 and an external circuit.

Replacement-information memory circuit 5 of this embodiment, with reference to FIG. 2 which is a detailed circuit diagram of it, will be described which comprises: n-channel memory transistors MQ51 to MQ53 each storing bits BA1, BA2, these constituting block address BA, and replacement-request information RA, respectively; p-channel transistors Q51 to Q53 with drain electrodes connected to the drain electrodes of memory transistors MQ51 to M Q53 and with gate electrodes receiving chip-enable signal CE; output circuits 55a to 55c having the same circuit configuration; for example, 55 consisting of a depletion mode n-channel transistor Q54 with a source electrode connected to the drain electrode of memory transistor MQ51 and with a gate electrode connected to ground potential, an inverter IV51 with an input terminal connected to the drain electrode of transistor Q54 from which replacement information BA1 is output, and p-channel transistors 57 with a source electrode connected to supply voltage Vcc and with drain and gate electrodes connected to the input of inverter 1V51 ; drain-, gate- and source- supply voltages 51, 52 , 53 which respond to control signals (CE, IPR, IR) in write mode and in normal mode to supply specified voltages to drain, control gate, and source electrodes; and selectors 54a to 54c for allowing in write mode to supply the specified voltages from voltage supply circuits 51 to 53 selectively through transistors Q51 to Q53 to the drain electrodes, and directly to control gate electrodes and source electrodes of memory transistors MQ 51 to MQ53 , and in normal mode to simultaneously supply the voltages.

Drain-voltage supply circuit 51 , once memory transistors MQ51 , MQ53 changes to enhancement mode, outputs a higher voltage (such as 12 V) than supply potential Vcc such as 5 V, and once they changes to depletion mode and also in normal mode, their output terminals become disconnected from the source electrodes of transistors Q51 to Q 53.

Gate-voltage supply circuit 52 outputs a higher voltage (12 V) than supply potential Vcc (5 V) upon changing memory transistors MQ51 to MQ53 to enhancement mode, and outputs ground potential upon changing them to depletion mode and in normal mode.

Source voltage supply circuit 53 outputs a higher voltage (12 V) than supply potential Vcc (5 V) upon changing memory transistors MQ51 to MQ53 to depletion mode and outputs ground potential upon changing them to enhancement mode and in normal mode.

Figure 3:
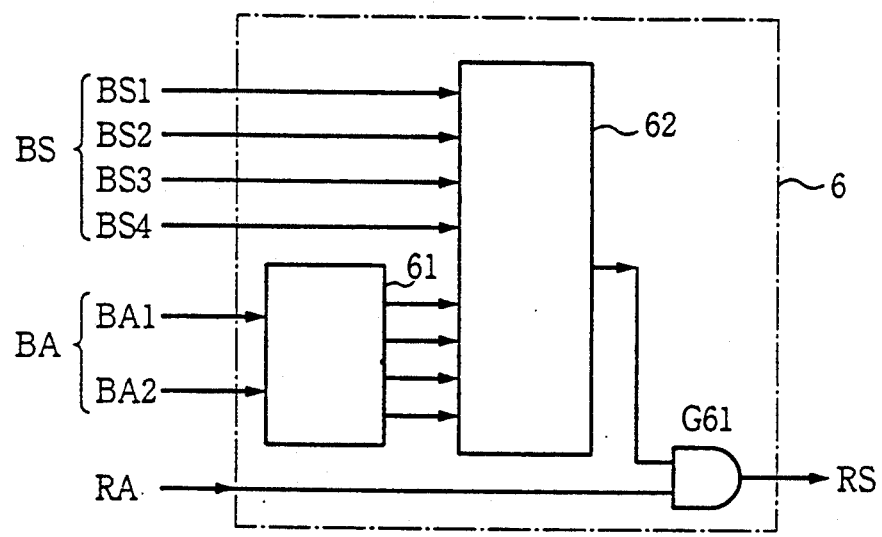
FIG. 3 is a block diagram of the redundancy selector of FIG. 1.

Reference to FIG. 3 is made in which a detailed circuit configuration of redundancy selector 6 is diagrammed which comprises a decoder 61 for decoding block address BA (BA1, BA2), a detector 62 for outputting a signal which goes to active level when block signals BS (BS1 to BS4) from decoder 3 and output signals of decoder 61 are coincident, and a logic gate G61 for outputting a redundancy signal RS which is the logical product of replacement-request information RA and the output of detector 62.

Figure 2:
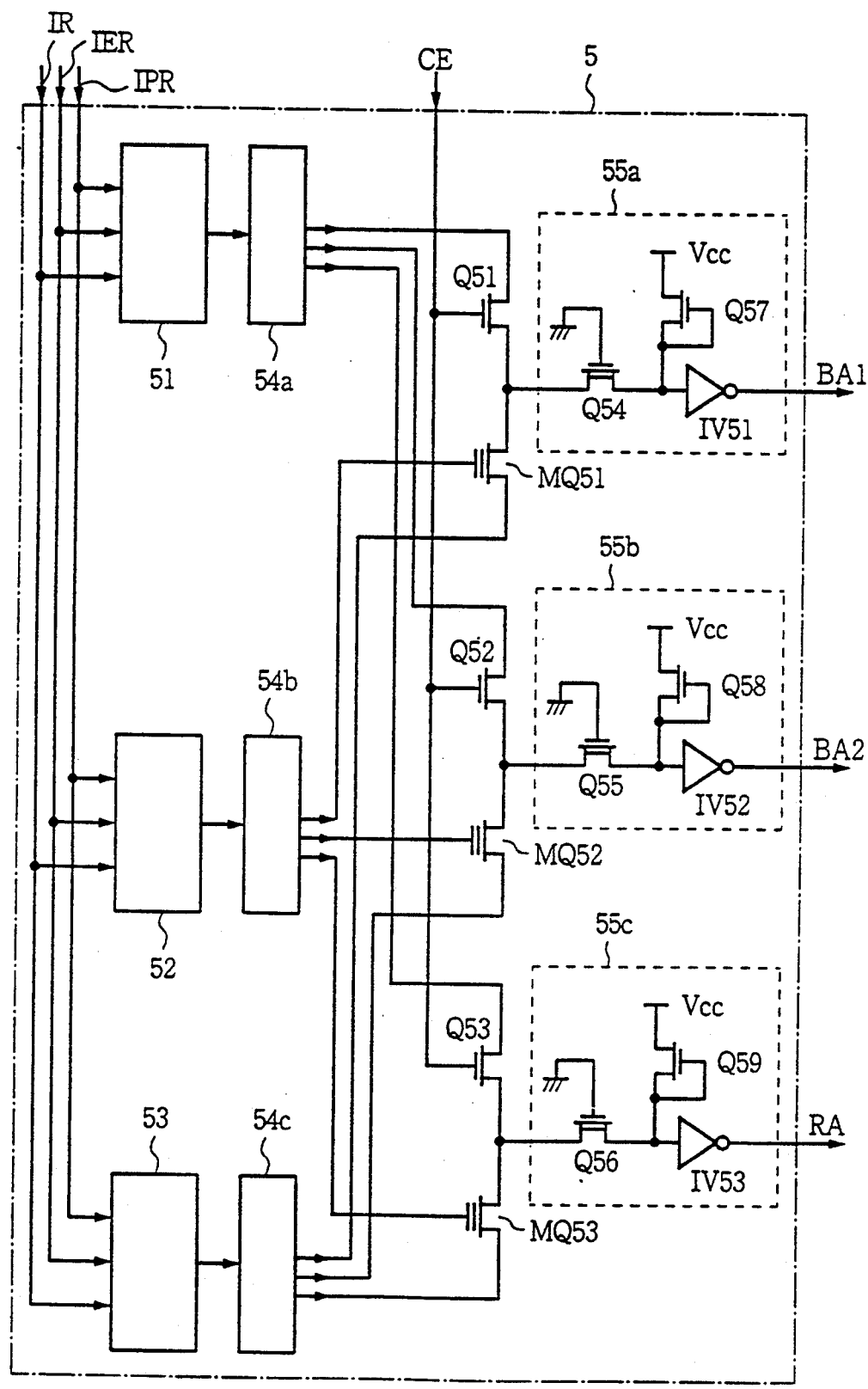
FIG. 2 is a detailed block circuit diagram of the replacement-information memory circuit of FIG. 1.

Referring to FIGS. 1 to 3, writing information into memory transistors MQ51 to MQ53 and operation of the parts will be described.

After product test process including the operation test of all memory cells of the memory cell array 1, the drain electrodes and control electrodes of all memory transistors MQ51 to MQ53 are charged to a high voltage (12 V) and source electrode is charged to ground electroder and thereby hot electrons are generated and injected to charge the floating gates, resulting in change of these memory transistors to enhancement mode.

When the product tests have revealed no faulty cell in memory cell array 1, the output terminals of drain-voltage supply circuits 51 and selector 54a are set so that the source electrodes of transistors Q51 to Q53 are floating and the output voltages of gate- and source-voltage supply circuits 52 , 53 and selectors 54b, 54c are set so that the control gate electrodes and source electrodes of memory transistors MQ51 to MQ53 are charged to ground potential.

Figure 4A:
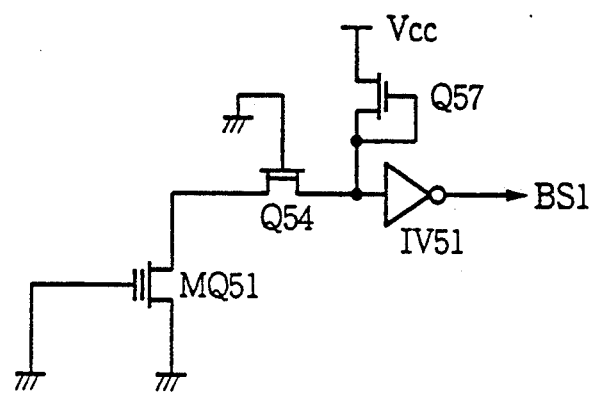
FIGS. 4(a) and 4(b) are equivalent circuit diagrams of a memory transistor and the associated elements for illustrating the operation and effects of the first embodiment.

Consequently, the normal-mode equivalent circuits of memory transistors MQ51 to MQ53 and the associated elements are similar, and for example, that of MQ51 is as shown in FIG. 4(a). Under this interconnection, memory transistor MQ51 allows no current to flow through it, so that the input terminal of inverter IV51 is kept at a voltage lower by the threshold voltage of transistor Q57 than supply potential Vcc, and the output terminal, that is block address BS1, is kept at approximately ground potential. Likewise no current flows through memory transistors MQ52, MQ53, and hence block address BS2 and replacement-request information RA are kept at ground potential. Therefore, redundancy signal RS, which is the output of logic gate G61, which receives replacement-request information RA of ground potential (low or inactive level), goes to an inactive or low level. This causes write/sense amplifier 7b to get inactivated and switching circuit 8 to be in position to connect to memory cell array 1. Thus write or read of data into or from memory cell array 1 is accomplished.

If a faulty cell is detected in memory cell array 1 by the product tests, the block address BA of the cell array block containing the faulty cell is written on memory transistors MQ51, MQ52 and active-level replacement-request information RA is written on memory transistor MQ 53. For writing block address BA, one binary value "1" or "0" is assigned to depletion mode and the other to enhancement mode.

For example, cell array blocks 11a, 11b, 11c, 11d are assigned addresses "00", "01","10", "11". Now if cell array block 11c contains a faulty cell, the control gate electrode of memory transistor MQ52 is charged to ground potential and the source electrode to the high voltage (12 V), and thereby Fowler-Nordheim tunneling current flows to extract electrons from the floating gate. Consequently, memory transistor MQ52 changes into depletion mode. Simultaneously memory transistor MQ53 is also changed into depletion mode. Thus writing of active-level replacement-request information is completed.

Thereafter the source electrodes of transistors Q51 to Q53 are caused to be floating, and then the drain-, gate- and source-voltage supply circuits 51 , 52 , 53 and selectors 54a to 54c are set so that control gate electrodes and source electrodes of memory transistors MQ 51 to MQ58 are charged to ground potential.

Under these conditions, in normal mode, depletion-mode memory transistors MQ52 , MQ53 turns ON. Then if the on-resistances of memory transistors MQ52, MQ53 and transistors Q55, Q56; Q58, Q59 are set so that the input potentials of inverters IV52, IV53 are set to be lower than their threshold voltages (if similarly set also when memory transistor MQ51 is ON), the output terminals of inverters IV52 , IV53, hence both block address BS2 and replacement-request information RA go to high or active level (logic "1"). Accordingly, the output signal of decoder 61 has only the bit corresponding to cell array block 11c caused to go to active level. If address signal ADc selects cell array block 11c, the output signal of detector 62 goes to active level. This signal and replacement information RA of active level are input to logic gate G61 which consequently outputs an active-level redundancy signal RS. Upon receiving this signal write/sense amplifier 7b is activated and switching circuit 8 makes the connection to redundancy cell array 2 which works as a replacement for cell array block 11c. Thus write or readout of data to or from the redundancy cell array 2 is carried out.

When an address signal ADc selects any cell array block except cell array block 11c, detector 62 provides inactive level output, and in turn redundancy signal RS goes inactive. Thus replacement by redundancy cell array 2 will not made.

Figure 4B:
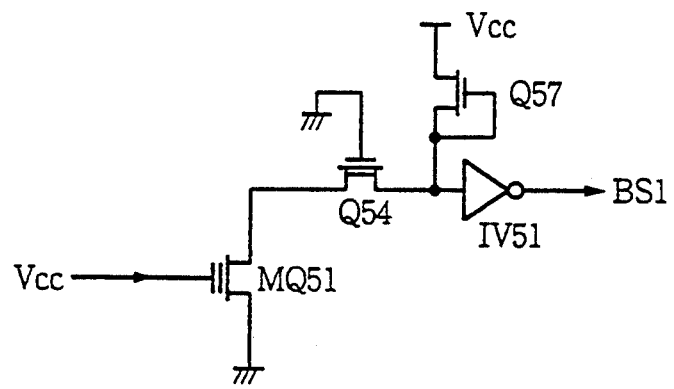

Referring to FIG. 4(a), the equivalent circuit involving memory transistor MQ51 and the associated elements will be described below. This description is applied similarly to memory transistors MQ52, MQ53 and the associated elements, and description of these is omitted. In a conventional semiconductor device, as diagrammed in FIG. 4(b), in the normal mode, the control gate electrode of memory transistor MQ51 is always kept at supply potential Vcc, thereby the corresponding large unidirectional electric field is always applied to the accumulated electrons on the floating gate between the control gate electrode and the source electrode. Due to the resulting very small Fowler-Nordheim current and through micro defects in the insulating film, the accumulated electrons on floating gate leaks away little by little. Accordingly long-time use results in fadeaway of the memory replacement-information on memory transistor MQ51. To the contrary, in the memory device according to the present invention, as shown in FIG. 4(a), in the normal mode, the control gate electrode of memory transistor MQ51 (similarly MQ52, MQ53) is kept at ground potential in the same way as source electrode. The drain electrode is held at a potential lower by at least the threshold voltage of transistor Q57 than the supply potential Vcc. As mentioned above, the control gate and source electrode are at the same potential, and hence no electric field will occur between them. In the case of depletion-mode of memory transistor MQ51, the difference in potential between the control gate electrode and drain electrode depends on the on-resistance of the memory transistor, assuming to share supply voltage Vcc by the resistances of the memory transistor and transistors Q57, Q54. Besides, this potential corresponds to the lower memory level of the binary replacement-information of the memory transistor, and hence has a near ground potential. Memory transistor MQ5 1, in the case of enhancement mode of it, is OFF, and therefore the potential of the drain electrode goes to a level lower by the threshold voltage of transistor Q57 than supply voltage Vcc. This value correspondents to the higher memory level of the memory transistor. By inverters IV51, however the higher level can be set to greatly lower than supply potential Vcc, so far as discrimination with the described low level is possible. This permits to so remarkably decreases the electric field applied to the accumulated charge of the floating gate compared with the prior art example that the accumulated charge can not leak through the insulating film even if it is very thin and has micro flaws. Thus memory transistors MQ51 to MQ53, owing to no fadeaway of the memory replacement-information of it, can endure a long-term use.

Figure 5:
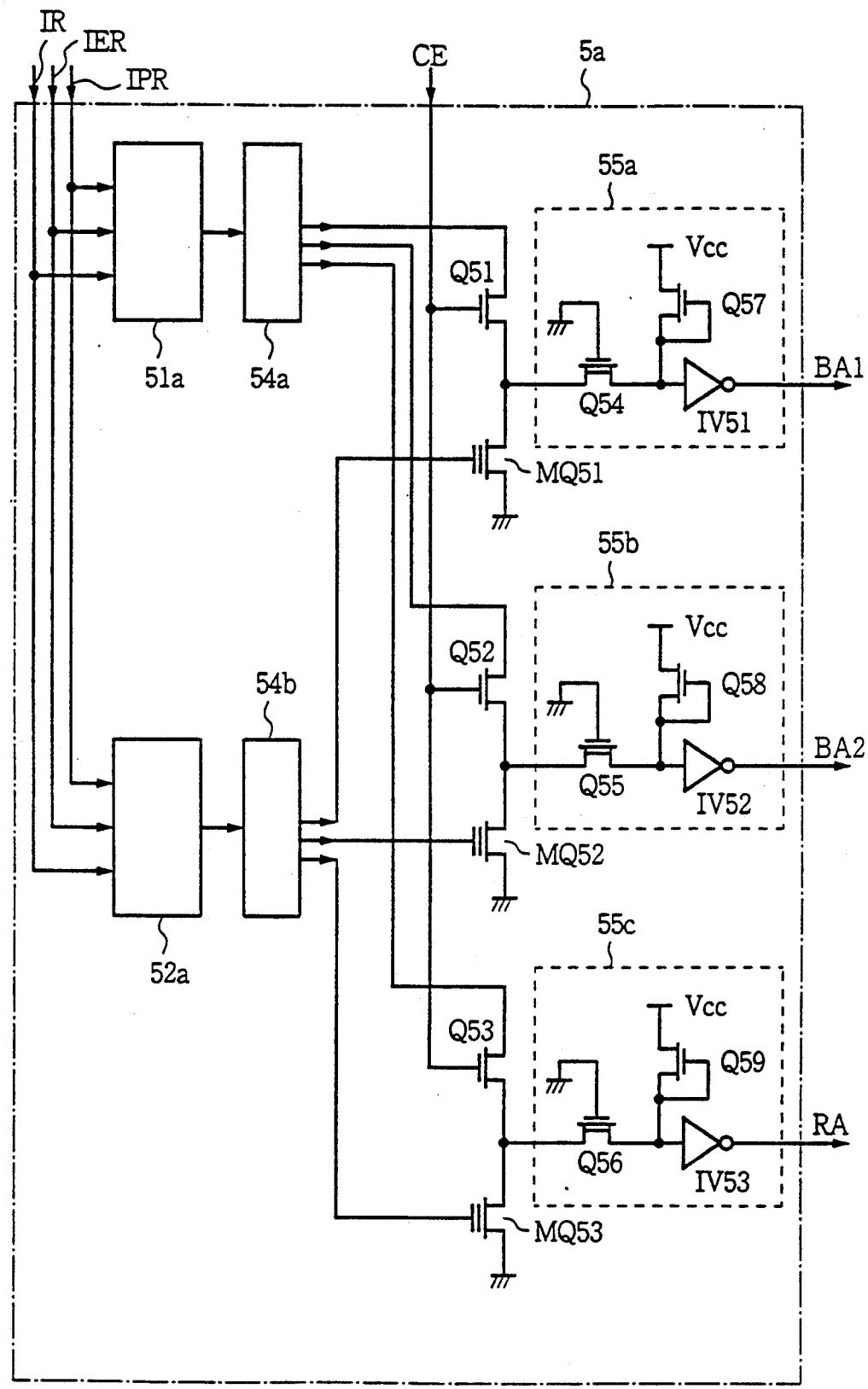
FIG. 5 is a detailed block circuit diagram illustrating a modified form of the replacement-information memory circuit of FIG. 1.

Reference to FIG. 5 is made which diagrams a modified replacement-information memory circuit 5a which is distinguished from replacement-information memory circuit 5 in FIG. 2 in the respect that the source electrodes of MQ51 to MQ53 are connected to ground potential to omit the source-voltage supply circuit 53 and selector 54c. In addition, the output voltage of drain-voltage supply circuit 51 is set to ground potential or a high voltage (12 V) to cause the memory transistors to become enhancement or depletion mode, and the output voltage of gate-voltage supply circuit 52 is set to the high voltage (12 V) or ground potential to cause the memory transistors to becomes enhancement or depletion mode.

With this replacement-information memory circuit 5a, memory transistors MQ51 to MQ53 is caused to become enhancement mode by setting the output voltages of drain- and gate supply circuits 51a, 52a to ground potential and the high voltage (12 V), with the result of causing Folower-Nordheim tunneling current flow accompanied by injection of electrons to the floating gates. They are caused to become depletion mode by setting the output voltages of drain- and gate supply circuits 51a, 52a to the high voltage (12 V) and ground potential, with the result of causing Folower-Nordheim tunneling current flow accompanied by extraction of electrons from the floating gates. The others are the same as circuit 5 diagrammed in FIG. 2. This modified embodiment can have the same effects as described above without needing source-voltage supply circuit 53 and selector 54c, therefore with simplified circuitry.

Figure 6:
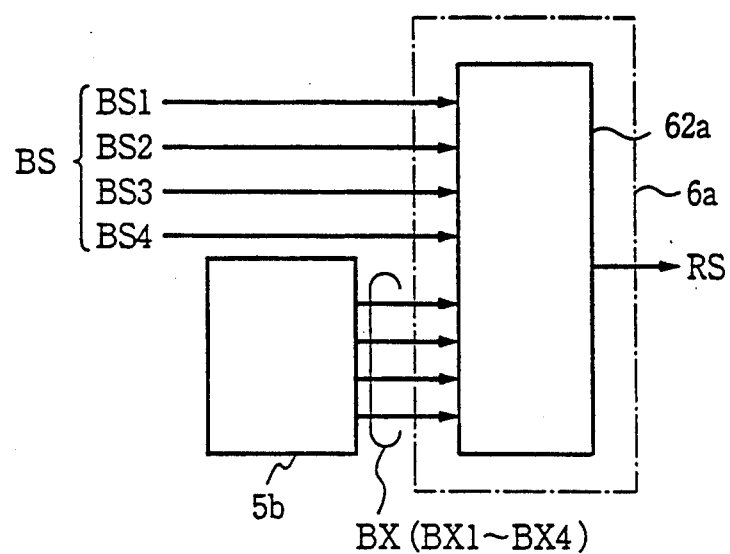
FIG. 6 is a block diagram of another modified replacement-information memory circuit and a modified redundancy signal generator.

Reference to FIG. 6 is made which diagrams the second modified replacement-information memory circuit 5b and a modified redundancy selector 6a. The former is constructed to store block information collectively BX (BX1 to BX4) on memory transistors (not shown in FIG. 6) corresponding to cell array blocks 11a to 11d, respectively. Redundancy selector 6a compares block signals, collectively BS (BS1 to BS4), with block replacement information BX (BX1 to BX4), and if coincidence is detect between both, outputs an active-level redundancy signal RS.

All of block information collectively BX (BX1 to BX4) are at inactive level when no faulty cell exists in memory cell array 1. If a faulty cell is detected in a cell array block, one of the replacement information corresponding to the cell array block goes to active level.

This circuit configuration contributes to simplifying redundancy selector though it increases the number of memory transistors in the replacement-information memory circuit.

Figure 7:
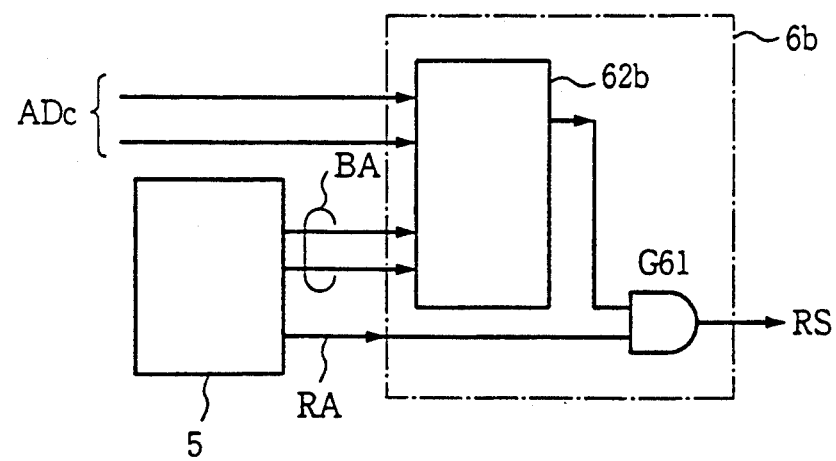
FIG. 7 is a block diagram of a replacement information memory circuit and a redundancy signal generator of the second embodiment.

Reference to FIG. 7 is made which diagrams a replacement-information memory circuit 5 and a redundancy selector 6b in the second embodiment of the present invention. The memory circuit is the same as either of the memory circuits 5, 5a in the first embodiment. Redundancy selector 6b consists of a detector 62b responding coincidence between block address BA and address signal ADc by outputting an active-level signal and a logic gate G61 outputting as a redundancy signal RS the logic product of the output from detector 62a and replacement-request information RA from replacement-information memory circuit 5 or 5a.

This embodiment has the same effects as has the first embodiment because of having replacement-information memory circuit 5 or 5a in the same way as the first embodiment. Additional effect is to need a reduced number of address signal ADc lines for transferring block information of cell array blocks 11a to 11d.

Two embodiments and some modifications have been described above which comprise one redundancy cell array per four cell array blocks, and the numbers of these are set taking incidence of faulty cells, memory capacity of cell array block, chip area, and economy into consideration. Moreover the type of the memory array cells is not limited. With memory cells of the same type, EEPROM, as the memory transistors in the replacement-information memory circuit, these memory elements are fabricated in one and the same process, and therefore the application of the present invention to this type semiconductor memory device is very advantageous.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments as fall within the true scope of the invention.

What is claimed is:

1. A semiconductor memory device comprising:

a memory cell array including a plurality of cell array blocks, each cell array block having a plurality of memory cells, data being written into or read from a memory cell;

a redundancy cell array means for serving as a replacement of a cell array block containing a faulty memory cell in response to an active-level redundancy signal;

a block selector means, coupled to said memory cell array, for selecting one of said cell array blocks to transfer data to or from in response to a set of block selection signals;

a replacement-information memory circuit including a plurality of memory transistors, each of said memory transistors having a gate, a drain and a source, each of said memory transistors capable of being changed to one of a depletion mode and an enhancement mode depending on the accumulated charges in a floating gate, whereby said replacement-information memory circuit stores replacement-information including replacement-information for deciding whether replacement by said redundancy cell array is needed and discrimination information for discriminating said cell array block containing said faulty memory cell controlling said accumulated charges in said floating gate electrode in a data-write operation mode;

voltage supply means, coupled to said drain, gate and source of each of said memory transistors, for supplying ground potential to said source and gate of each of said memory transistors and for supplying a predetermined voltage to said drain of each of said memory transistors in a normal mode; and a redundancy selector means, coupled to said replacement-information memory circuit and receiving said set of block selection signals, for outputting said redundancy signal to an active level in response to each information output from said replacement-information memory circuit that represents that said cell array block containing said faulty memory cell is selected by said set of block selection signals.

2. A semiconductor memory device as claimed in claim 1, wherein said replacement-information memory circuit further includes an output circuit means for transferring the replacement information stored on said plurality of memory transistors to said redundancy selector means.

3. A semiconductor memory device as claimed in claim 2, wherein said output circuit means includes for each of said plurality of memory transistors
- a first depletion mode transistor having source and drain electrodes, one of which is connected to the drain of said memory transistor, and a gate connected to a specified potential,
- an invertor having an input terminal connected to the other of the source and drain electrodes of said first transistor and an output connected to an output terminal of said replacement-information memory circuit, and
- a second transistor of the opposite conductivity type to said memory transistor with a source electrode connected to a supply source potential and drain and gate electrodes connected to the input terminal of said invertor.

4. The memory device of claim 1, wherein said voltage supply means feature includes means for supplying a high voltage to said drain and said gate and a ground potential to said source of selected ones of said plurality of memory transistors to change said selected ones of said memory transistors to said enhancement mode.

5. A semiconductor memory device as claimed in claim 1, wherein said voltage supply means further includes
- a drain voltage supply means for applying a specified high voltage to said drains of said plurality of memory transistors to thereby force them into enhancement mode, or being disconnected from said drain of said plurality of memory transistors to thereby force them into depletion mode respectively and also in normal mode,
- a gate voltage supply circuit for applying the specified high voltage to said gates of said plurality of memory transistors to be forced into enhancement mode, or ground voltage to said gates of said plurality of memory transistors to be forced into depletion mode and in normal mode, and
- a source voltage supply circuit for applying the specified high voltage to the sources of said plurality of memory transistors to be forced into depletion mode, or ground potential to the sources of said plurality of memory transistors to be forced into enhancement mode and in normal mode.

6. A semiconductor memory device as claimed in claim 1, wherein the sources of said plurality of memory transistors are connected to ground potential, and said voltage supply means includes
- a drain-voltage supply circuit for applying ground potential to the drains of said plurality of memory transistors to be forced or the specified high voltage to the drains of said plurality of memory transistors to be forced into enhancement mode or into depletion mode and
- a gate-voltage supply circuit for applying ground potential to the gates of said plurality of memory transistors to be forced into enhancement mode, or the specified high voltage to the gates of said plurality of memory transistors to be forced into depletion mode and in normal mode.

7. A semiconductor memory device as claimed in claim 2, wherein the discrimination information of said cell array block containing a faulty memory cell is stored in the form of address information corresponding to a cell address.

8. A semiconductor memory device as claimed in claim 2, wherein the discrimination information of said cell array block containing a faulty memory cell and replacement information stored in said memory transistors provide a one-to-one correspondence of said cell array blocks.

9. The memory device of claim 3 wherein said voltage supply means further includes means for supplying a high voltage to said drain and a ground potential to said source and said gate of selected ones of said memory transistors to change said selected ones of said memory transistors to said depletion mode.

10. The memory device of claim 9, further including amplifier switching means coupled to said block selector means and said redundancy selector means for transferring data to or from one of said cell array blocks selected by said block selector means or said redundancy cell array means in accordance with a signal received from said redundance selector means.

11. A method for storing replacement information for a semiconductor storage device having a memory cell array including a plurality of cell array blocks, each consisting of a number of memory cells, data being written into or read from a memory cell, a redundancy cell array responding to an active-level redundancy signal and serving as a replacement of a cell array block containing a faulty cell, and a replacement-information memory circuit including a plurality of memory transistors, each of said memory transistors having a gate, a drain and a source, each of said memory transistors capable of being changed to one of a depletion mode and an enhancement mode depending on the accumulated charges in a floating gate, the method comprising the steps of:

(a) supplying a first set of voltages to selected one or ones of said memory transistors in a data-write operation mode to changes said selected one or ones of said memory transistors to said enhancement mode;

(b) supplying a second set of voltages to remaining one or ones of said memory transistors in said data-write operation mode to change said remaining one or ones of said memory transistors to said depletion mode; and (c) supplying a ground potential to the gate and source of each of said memory transistor in a normal mode.

* * * * *